US011830902B2

(12) United States Patent
Hara et al.

(10) Patent No.: US 11,830,902 B2
(45) Date of Patent: Nov. 28, 2023

(54) SEMICONDUCTOR APPARATUS

(71) Applicant: Canon Kabushiki Kaisha, Tokyo (JP)

(72) Inventors: Koji Hara, Chiba (JP); Yusuke Onuki, Kanagawa (JP); Tsuyoshi Miyagawa, Kanagawa (JP); Shinichi Saeki, Tokyo (JP); Shinsuke Kojima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 17/375,134

(22) Filed: Jul. 14, 2021

(65) Prior Publication Data
US 2022/0020808 A1 Jan. 20, 2022

(30) Foreign Application Priority Data
Jul. 16, 2020 (JP) .................. 2020-122012

(51) Int. Cl.
*H01L 27/146* (2006.01)
*H01L 23/528* (2006.01)
*H01L 23/522* (2006.01)
*H04N 25/76* (2023.01)

(52) U.S. Cl.
CPC ...... *H01L 27/14636* (2013.01); *H01L 23/528* (2013.01); *H01L 23/5226* (2013.01); *H04N 25/76* (2023.01)

(58) Field of Classification Search
CPC ............. H01L 27/14636; H01L 27/146; H01L 27/1464; H01L 23/5226; H01L 23/528; H01L 23/5283; H04N 25/00; H04N 25/47; H04N 25/76
See application file for complete search history.

(56) References Cited

U.S. PATENT DOCUMENTS

| | | | |
|---|---|---|---|
| 10,573,680 B2 | 2/2020 | Shimotsusa | |
| 2014/0160259 A1* | 6/2014 | Blanquart | H04N 25/75 348/65 |
| 2016/0057370 A1 | 2/2016 | Tanaka | |
| 2018/0138225 A1* | 5/2018 | Kim | H04N 25/75 |
| 2018/0166492 A1 | 6/2018 | Aoki | |
| 2018/0240797 A1 | 8/2018 | Yokoyama et al. | |
| 2019/0157333 A1* | 5/2019 | Tsai | H01L 21/78 |
| 2019/0252444 A1 | 8/2019 | Ryoki et al. | |
| 2020/0035737 A1* | 1/2020 | Ito | H01L 27/14636 |

FOREIGN PATENT DOCUMENTS

JP 2012019147 A 1/2012

* cited by examiner

*Primary Examiner* — Galina G Yushina
(74) *Attorney, Agent, or Firm* — Venable LLP

(57) ABSTRACT

A semiconductor apparatus including: a first substrate; a first wiring structure; a second substrate; and a second wiring structure, wherein the first wiring structure has a first wiring layer bonded to wiring of the second wiring structure, a second wiring layer connected to the first wiring layer by a first via, and a third wiring layer connected to the second wiring layer by a second via, at least part of the second via is located at a range distanced, by at least a width of the first via, from an axis of the first via, a thickness of the second wiring layer is less than the width of the first via, a major constituent of the first wiring layer, the second wiring layer and the first via is copper, and a layer that is made from a material different from copper is disposed between the first via and the second wiring layer.

24 Claims, 4 Drawing Sheets

SEMICONDUCTOR APPARATUS

BACKGROUND

Field

The present disclosure relates to a semiconductor apparatus.

Description of the Related Art

In a semiconductor apparatus, two substrates are physically bonded via a bonding part to achieve downsizing and improvement in functionality of the semiconductor apparatus. Japanese Patent Application Publication No. 2012-019147 describes a solid-state image pickup apparatus that is formed by bonding a first substrate having a photoelectric conversion device and a second substrate having other circuits. In Japanese Patent Application Publication No. 2012-019147, a copper bonding pad is used for the bonding.

However, according to the bonding method described in Japanese Patent Application Publication No. 2012-019147, electromigration of metal atoms constituting wires may cause breaking. Therefore, due to a constraint such as a prescribed upper limit for current density, use in a state where the performance is suppressed is taken into account.

Further, according to the method of Japanese Patent Application Publication No. 2012-019147, a diffusion preventing film that prevents metal atoms from diffusing from a bonding part needs to be a finer film than an interlayer, and the bonding part is difficult to be micromachined. Thus, the processed scale tends to be different at a part of connection between the bonding part and underlying wiring. In wiring including such difference in scale, generation and growth of a void due to electromigration easily lead to breaking of underlying microwires.

SUMMARY

An object of the present disclosure is to provide a semiconductor apparatus that is capable of reducing the risk of breaking due to electromigration.

The present disclosure in one aspect thereof provides a semiconductor apparatus including: a first substrate on which a semiconductor device is arranged; a first wiring structure that is arranged on the first substrate; a second substrate on which a semiconductor device is arranged; and a second wiring structure that is arranged on the second substrate, wherein the first wiring structure has a first wiring layer that is bonded to wiring of the second wiring structure, a second wiring layer that is connected to the first wiring layer by a first via, and a third wiring layer that is connected to the second wiring layer by a second via, at least part of the second via is located at a range distanced, by at least a width of the first via, from an axis that passes through a center of the first via, a thickness of the second wiring layer is less than the width of the first via, a major constituent of the first wiring layer, the second wiring layer and the first via is copper, and a layer that is made from a material different from copper is disposed between the first via and the second wiring layer.

The present disclosure in another aspect thereof provides a semiconductor apparatus including: a first substrate on which a semiconductor devices is arranged; a first wiring structure arranged on the first substrate; a second substrate on which a semiconductor device is arranged; and a second wiring structure arranged on the second substrate, wherein the first wiring structure has a first wiring layer that is bonded to wiring of the second wiring structure, a second wiring layer that is connected to the first wiring layer by a first via, and a third wiring layer that is connected to the second wiring layer by a second via, at least part of the second via is located at a range distanced, by at least a width of the first via, from an axis that passes through a center of the first via, a thickness of the second wiring layer is less than the width of the first via, and a wiring width of the second wiring layer in a direction orthogonal to a direction where the first via and the second via are connected is more than the width of the first via at least in a range where a plane distance from the axis passing through the center of the first via is within the width of the first via.

The present disclosure can provide a semiconductor apparatus that is capable of reducing the risk of breaking due to electromigration.

DESCRIPTION OF THE EMBODIMENTS

The present disclosure will be described in detail using the drawings. The present disclosure is not limited to the following embodiments.

The structure of a semiconductor apparatus according to the embodiments of the present disclosure will be described using FIGS. 1 to 3A, and 3B to 7. In the following description, a principal surface of a first substrate and a principal surface of a second substrate are surfaces of the substrates where semiconductor devices are formed. The opposite surfaces that face the principal surfaces are back surfaces of the first substrate and the second substrate. An up direction is defined as a direction from a back surface toward the corresponding principal surface, and a down direction or a depth direction is defined as a direction from a principal surface of a substrate to the corresponding back surface. The coordinate system in the following description directs the X axis and the Y axis in a direction parallel to the principal surfaces, and the Z axis in a direction perpendicular to the principal surfaces. A thickness or height of some member is a length of the member in a direction orthogonal to the principal surfaces of the substrates, that is, the Z axis direction. A direction in which the first substrate and the second substrate are superposed is defined as a superposed direction, that is, the Z axis direction or the Z direction. A direction orthogonal to the superposed direction or the Z axis direction is defined as a plane direction, that is, the X-Y axis direction, the X axis direction, the X direction, or the Y axis direction or the Y direction. In the following description, a plane distance between two elements means a distance between these two elements in the plane direction when the components of a direct distance between these two elements are resolved into the component in the superposed direction and the component in the plane direction (vector resolution).

Figure 1:
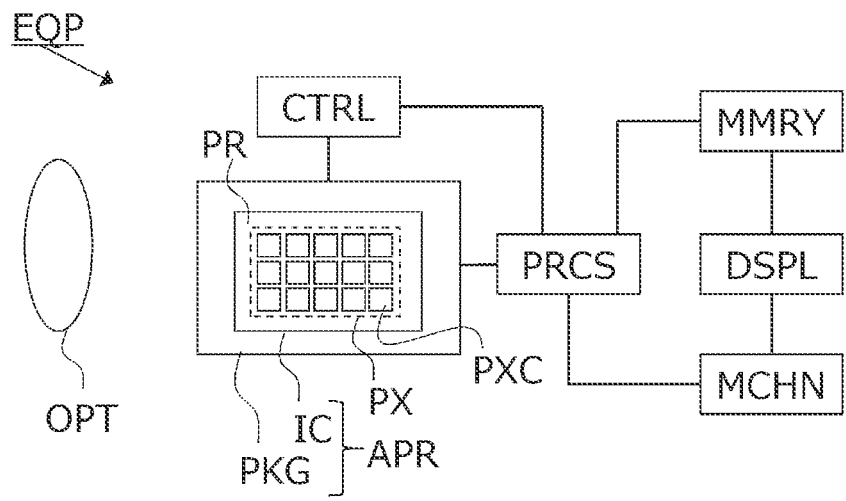
FIG. 1 is an explanatory schematic view of a semiconductor apparatus according to Embodiments.

First, the outline of a semiconductor apparatus APR will be hereinafter described with reference to FIG. 1. FIG. 1 is an explanatory schematic view of the semiconductor apparatus APR according to the present embodiment.

The semiconductor apparatus APR includes a semiconductor device IC, and may include a package PKG for packaging the semiconductor device IC, in addition to the semiconductor device IC. In the present embodiment, the semiconductor apparatus APR is a photoelectric convertor (solid-state image pickup apparatus). The semiconductor device IC has a structure such that a first semiconductor chip or a first semiconductor component where pixel circuits PXC are matrix-arrayed, and a second semiconductor chip or a second semiconductor component with which a peripheral circuit is provided are stacked, that is, a chip-stacking structure. In the first semiconductor chip, a region where the pixel circuits PXC are matrix-arrayed is a pixel region PX. The pixel region PX may include a light-sensing pixel region or a valid pixel region, and a shaded pixel region. A peripheral region PR that is located around the pixel region PX is provided with part of the peripheral circuit, a bonding pad for external connection via bonding wires, etc.

The semiconductor apparatus APR is included in equipment EQP. The equipment EQP may be provided with at least any of an optical system OPT, a controller CTRL, a processor PRCS, a display DSPL, a memory MMRY and machinery MCHN. The equipment EQP will be described in detail later.

Figure 2:
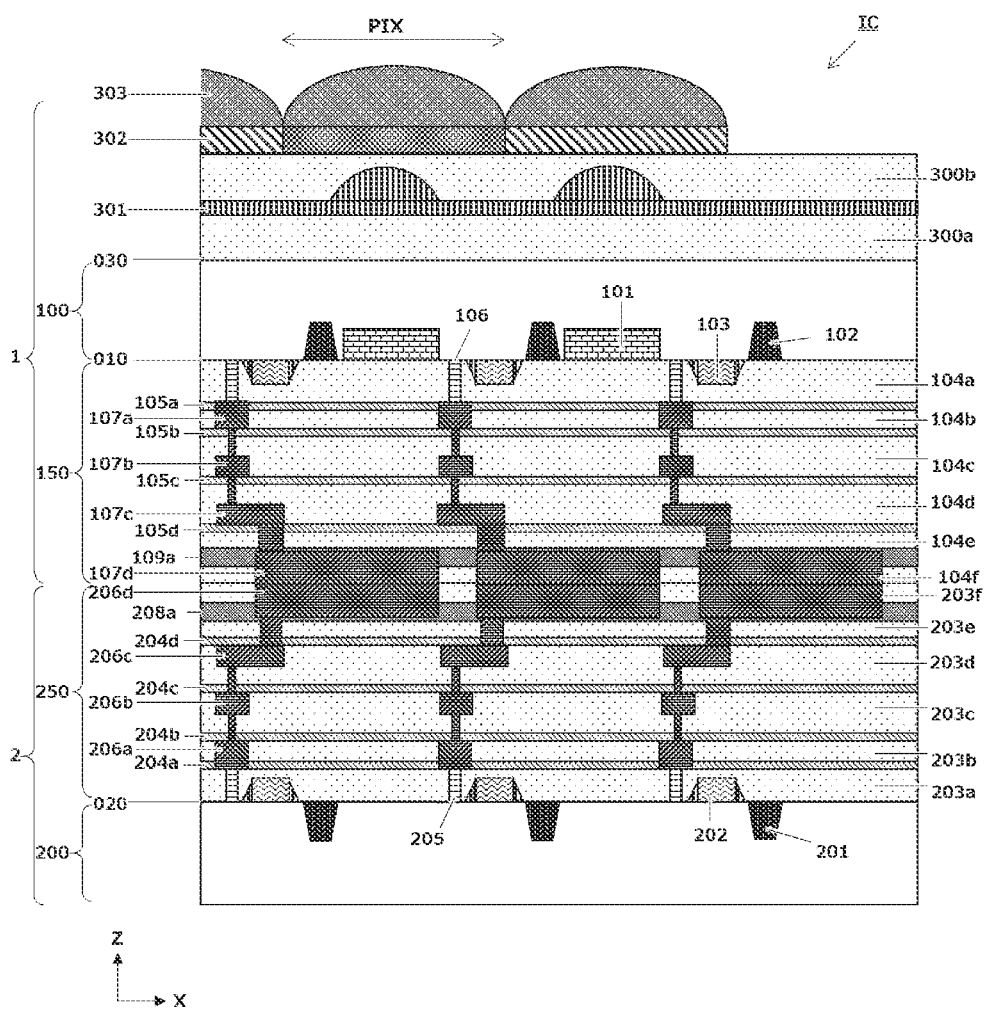
FIG. 2 is an explanatory schematic cross-sectional view of the semiconductor apparatus according to Embodiments.

FIG. 2 is a schematic view of a XZ cross section of the semiconductor apparatus APR according to this embodiment. The semiconductor apparatus APR is a CMOS image sensor including a first substrate 100 such that the pixel circuits including photoelectric conversion devices are arrayed on a principal surface thereof, and a second substrate 200 such that circuits are arrayed on a principal surface thereof. The semiconductor apparatus APR may be a CCD image sensor. Examples of the circuits arrayed on the principal surface of the second substrate 200 include at least part of the peripheral circuit including a readout circuit for reading out signals based on electric charges of the photoelectric conversion devices, and a control circuit. One example of the peripheral circuit is a vertical scanning circuit, a horizontal scanning circuit and an amplifier circuit. When the semiconductor apparatus APR is configured as a CCD image sensor, for example, the circuits arrayed on the principal surface of the second substrate 200 may include a vertical transfer CCD that are disposed for each column, and a horizontal transfer CCD to horizontally transfer signals of each row which are transferred through the vertical transfer CCD.

The first substrate 100, a first wiring structure 150, a second wiring structure 250 and the second substrate 200 are arranged in this order to form the semiconductor apparatus APR. The first substrate 100 and the first wiring structure 150 constitute the first semiconductor component or semiconductor chip, and the second substrate 200 and the second wiring structure 250 constitute the second semiconductor component or semiconductor chip. Formation of bonded parts such that wiring layers 107d of the first wiring structure 150 and wiring layers 206d of the second wiring structure 250 are bonded results in electrical connection of the pixel circuits of the first substrate 100 and the peripheral circuit of the second substrate 200 via the bonded parts. The wiring layers 107d included in first wiring of the first wiring structure 150 and the wiring layers 206d included in second wiring of the second wiring structure 250 are bonded at the bonded parts, which results in the first wiring and the second wiring forming substrate-to-substrate wiring. The bonded parts in the substrate-to-substrate wiring may be arranged so as to be superposed on the pixel region PX, and may be arranged so as to be superposed on the peripheral region PR. In the example of FIG. 2, the bonded parts of the wiring layers 107d included in the first wiring, and the second wiring (the bonded parts to the wiring layers 206d) are superposed on the pixel region PX.

The first substrate 100 includes a semiconductor region that is formed on a semiconductor wafer by a known semiconductor manufacturing process. An example of the material of the semiconductor is silicon Si. The interface between the material of the semiconductor and another material is a principal surface 010 of the first substrate 100. Examples of the other material include a thermal oxide film not shown which is arranged on the first substrate 100 and which is in contact with the principal surface 010 of the first substrate 100. Photoelectric conversion parts 101 and isolations 102 are formed in the first substrate 100. Gate electrodes 103 and the first wiring structure 150 are arranged on the principal surface 010 of the first substrate 100 in the down direction in FIG. 2.

The first wiring structure 150 includes contact plugs 106, wiring layers 107a to 107d, dielectric films 104a to 104f as interlayer dielectric films, dielectric films 105a to 105d, and a dielectric film 109a. The wiring layers 107d contain barrier metals 108. The dielectric films 105a to 105d are diffusion preventing films for the wiring layers 107a to 107c, and for example, are made from SiC or SiOC. The dielectric film 109a is a diffusion preventing film for the wiring layers 107d, and for example, is made from SiN. The barrier metals 108 cover copper portions of the wiring layers 107d in order to prevent copper from diffusing through the dielectric film, and for example, are constituted of tantalum Ta or tantalum nitride TaN, titanium Ti, or titanium nitride TiN.

The second substrate 200 includes a semiconductor region that is formed on a semiconductor wafer by a known semiconductor manufacturing process. An example of the material of the semiconductor is silicon Si. The interface between the material of the semiconductor and another material is a principal surface 020 of the second substrate 200. Examples of the other material include a thermal oxide film not shown which is arranged on the second substrate 200 and which is in contact with the principal surface 020 of the second substrate 200. Isolations 201 are formed in the second substrate 200. Gate electrodes 202 and the second wiring structure 250 are arranged on the principal surface 020 of the second substrate 200 in the up direction in FIG. 2.

The second wiring structure 250 includes contact plugs 205, wiring layers 206a to 206d, dielectric films 203a to 203f as interlayer dielectric films, dielectric films 204a to 204d, and a dielectric film 208a. The wiring layers 206d contain barrier metals 207. The dielectric films 204a to 204d are diffusion preventing films for the wiring layers 206a to 206c, and for example, are made from SiC or SiOC. The dielectric film 208a is a diffusion preventing film for the wiring layers 206d, and for example, is made from SiN. The barrier metals 207 cover copper portions of the wiring layers 206d in order to prevent copper from diffusing through the dielectric film, and for example, are constituted of tantalum Ta or tantalum nitride TaN, titanium Ti, or titanium nitride TiN.

The wiring layers 107d of the first wiring structure 150 and the wiring layers 206d of the second wiring structure 250 each have bonding faces. The wiring layers 107d and the wiring layers 206d are physically and electrically connected to each other via these bonding faces. That is, the wiring layers 107d and the wiring layers 206d function as bonding members. In this embodiment, the wiring layers 107d and the wiring layers 206d, which form the bonded parts, each have dual damascene structures. However, one or both kind(s) of the wiring layers 107d and the wiring layers 206d, which form the bonded parts, may each have single damascene structures. The damascene structure is used as a general term for the dual damascene structure and the single damascene structure. While the wiring layers 107c, which are connected to the wiring layers 107d, have dual damascene structures in this embodiment, the wiring layers 107c may have single damascene structures.

A principal surface 030 or the back surface of the first substrate 100 which is on the opposite side of the principal surface 010 is a light incident surface. On the principal surface 030 side of the first substrate 100, dielectric film, 300a and 300b that are made from silicon oxide, a dielectric film 301 that is made from silicon nitride, color filter films 302 that are made from an organic material, and condenser lenses 303 are arranged along an optical path. Pixels PIX each having such a cross-sectional structure are arrayed on the first substrate 100, which is omitted in FIG. 2.

Figure 3A:
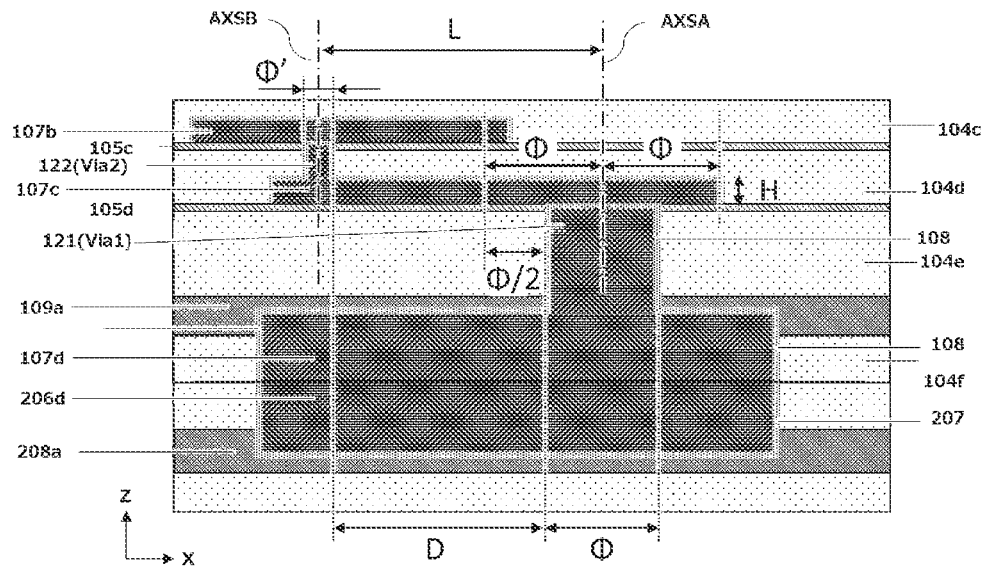
FIGS. 3A and 3B are schematic cross-sectional views of a bonded part of the semiconductor apparatus according to Embodiments.

The structure of the bonded parts of the semiconductor apparatus APR will be further described using FIG. 3A. FIG. 3A only shows part of the structure in FIG. 2.

As shown the wiring layer 107d or a first wiring layer, and the wiring layer 107c or a second wiring layer are electrically connected through a first via Via1 121. The wiring layer 107c or the second wiring layer, and the wiring layer 107b or a third wiring layer are electrically connected through a second via Via2 122.

As this embodiment, the wiring layer 107d, which has a dual damascene structure, has the first via 121 including a contact face with the wiring layer 107c, and a pad including the bonding face to the wiring layer 206d. In FIG. 3A, a portion corresponding to the pad is pointed as the wiring layer 107d for convenience. The inside of a trench with which the dielectric film 104f is provided is provided with the pad of the wiring layer 107d. The inside of a hole with which the dielectric film 104e is provided is provided with the first via 121 of the wiring layer 107d. The dielectric film 109a is used as an etch stop when the trench for the pad is formed in the dielectric film 104f. The width of the first via 121 in the wiring layer 107d, or the contact face with the wiring layer 107c, is less than the width of the pad in the wiring layer 107d. The first via 121 of the wiring layer 107d and the pad of the wiring layer 107d may be unitedly made from the same conductive material such as copper.

When the wiring layer 107d has a single damascene structure, a portion of the wiring layer 107d which includes a surface thereof on the wiring layer 107c side and which has a thickness half the wiring layer 107d can be defined as the first via 121. When the wiring layer 107d has a single damascene structure, a portion of the wiring layer 107d which includes a surface thereof on the wiring layer 206d side, or the bonding face, and which has a thickness half the wiring layer 107d can be defined as the pad. The first via 121 includes the contact face with the wiring layer 107c and the pad includes the bonding face to the wiring layer 206d as well when the wiring layer 107d has a single damascene structure. When the wiring layer 107d has a single damascene structure, the difference between the width of the first via 121 and the width of the pad of the wiring layer 107d is less than the thickness of the wiring layer 107d, and typically, the width of the first via 121 is approximately the same as the width of the pad. Here, the thickness of the wiring layer 107d can correspond to the distance between the wiring layer 206d, which is bonded to the wiring layer 107d, and the wiring layer 107c, which is connected to the wiring layer 107d through the first via 121.

The wiring layer 107c, which has a dual damascene structure, has the second via 122 including a contact face with the wiring layer 107b, and a wiring pattern including a contact face with the first via 121 or the wiring layer 107d. In FIG. 3A, a portion corresponding to the wiring pattern is pointed as the wiring layer 107c for convenience. The width of the second via 122 in the wiring layer 107c, or the contact face with the wiring layer 107d, is less than the width of the wiring pattern in the wiring layer 107c. The second via 122 of the wiring layer 107c and the wiring pattern of the wiring layer 107c may be unitedly made from the same conductive material such as copper.

When the wiring layer 107c has a single damascene structure, a portion of the wiring layer 107c which includes a surface thereof on the wiring layer 107b side and which has a thickness half the wiring layer 107c can be defined as the second via 122. When the wiring layer 107c has a single damascene structure, a portion of the wiring layer 107c which includes a surface thereof, or the contact face, on the wiring layer 107d side and which has a thickness half the wiring layer 107c can be defined as the pad. When the wiring layer 107c has a single damascene structure, the second via 122 includes the contact face with the wiring layer 107b and the wiring pattern includes the contact face with the first via 121 or the wiring layer 107d, When the wiring layer 107c has a single damascene structure, the difference between the width of the second via 122 and the width of the wiring pattern of the wiring layer 107c is less than the thickness of the wiring layer 107c, and typically, the width of the second via 122 is approximately the same as the width of the wiring pattern. Here, the thickness of the wiring layer 107c can correspond to the distance between the wiring layer 107d, which is in contact with the wiring layer 107c, and the wiring layer 107b, which is connected to the wiring layer 107c through the second via 122.

Here, the wiring layers 107d and 107c have been described. A pad and vias concerning the wiring layer 206d can be defined in the same manner as those concerning the wiring layer 107d. A wiring pattern and vias concerning the wiring layer 206c can be defined as well.

The pad and the vias in each wiring layer are not limited to be unitedly made from the same conductive material. The pad and the vias in each wiring layer may be made from different conductive materials. The wiring pattern and the vias in each wiring layer are not limited to be unitedly made from the same conductive material. The wiring pattern and the vias in each wiring layer may be made from different conductive materials. For example, the major constituent of the wiring pattern of each wiring layer may be aluminum and the major constituent of the vias thereof may be tungsten.

When the widths, typically the diameters of the first via 121 and the second via 122 are represented by $\Phi$ and $\Phi'$ respectively, $\Phi > \Phi'$, and may be $\Phi > 2\Phi'$, and further may be $\Phi > 3\Phi'$, for the reason described later. As one example, the width $\Phi$ of the first via is 0.38 μm, and the width $\Phi'$ of the second via is 0.14 µm. The width Φ of the first via may be within the range of at least 0.19 µm and not more than 0.57 µm, and the width Φ' of the second via may be within the range of at least 0.07 µm and not more than 0.21 µm.

For example, the major constituent of the wiring layers 107a to 107d, 206a, 206b and 206d, the first via 121 and the second via 122 is copper, and the major constituent of the wiring layer 206c is copper or aluminum. The major constituent of the wiring layer 206c being aluminum makes it possible to use a conductive pattern in the same layer as the wiring layer 206c, as a bonding pad for connecting the bonding wires. The barrier metals 108 and 207, and the diffusion preventing films 105a to 105d, 109a and 208a prevent the conductive material contained in the wiring layers, such as copper, from diffusing through the dielectric films and the semiconductor region therearound. Here, the barrier metal 108 is arranged between a portion of the wiring layer 107d which is made from a major conductive material such as copper, and the dielectric films 104f, 109a and 104e around the wiring layer 107d. The barrier metal 108 is also arranged between portions of the wiring layer 107d and the first via 121 which are made from a major conductive material, such as portions including copper as the major constituent, and a portion of the wiring layer 107c which is made from a major conductive material, such as a portion including copper as the major constituent. Therefore, the barrier metal 108 suppresses diffusion of the major conductive material, that is, copper contained in the wiring layer 107d and the wiring layer 107c, between the wiring layer 107d and the wiring layer 107c. When the conductive material such as copper contained in the wiring layer 206d has diffused through the dielectric film 104f, the dielectric film 109a suppresses further diffusion of the conductive material, which has diffused through the dielectric film 104f, through the dielectric film 104e. For example, the dielectric film 104f and the dielectric film 104e are silicon oxide films, and the dielectric film 109a is a silicon nitride film or a silicon carbide film. The major constituents of the wiring layers 107a to 107d and 206a to 206d, and the vias connecting these wiring layers are not particularly limited, and may be copper, gold, silver, aluminum, tungsten, and other good conductors.

In this embodiment, the second via 122 is located at the range distanced, by the width Φ of the first via 121, from an axis AXSA that passes through the center of the first via 121. The axis AMA passing through the center of the first via 121 can extend in the direction where the first substrate 100 and the second substrate 200 are superposed, that is, the direction parallel to the Z axis. In short, the axis AXSA passing through the center of the first via 121 is parallel to the Z axis, and can be vertical to the principal surfaces of the first substrate 100 and the second substrate 200. The second via 122 being located at a specific position may mean that the entire of the second via 122 is located on the specific position, and may mean that at least part of the second via 122 is located on the specific position. When the cross-sectional shape of the first via 121 is a circle having a diameter of Φ, the width of the first via 121 is the diameter Φ. Further, when the cross-sectional shape of the second via 122 is a circle having a diameter of Φ', at least part of the second via 122 is located at the range distanced, by the width of the first via 121, from the axis AXSA passing through the center of the first via 121 as long as a distance L between the central axis AXSA of the first via 121 and a central axis AXSB of the second via 122 in the plane direction (plane distance) is larger than Φ−Φ'/2 (L>Φ<−Φ/2). The entire of the second via 122 is located at the range distanced, by the width of the first via, from the axis AXSA passing through the center of the first via 121 as long as the distance L between the central axis AXSA of the first via 121 and the central axis AXSB of the second via 122 is larger than Φ+Φ/2 (L>Φ+Φ'/2). Preferably, the entire of the second via 122 is located at the range distanced, by the width of the first via, from the axis AXSA passing through the center of the first via 121. That is, preferably, the second via 122 is not located within a distance equal to the width Φ of the first via 121 with respect to the axis AXSA passing through the center of the first via 121. In this case, the distance between the axis AXSA passing through the center of the first via 121, and the second via 122 is more than the width Φ of the first via 121. A distance D between the first via 121 and the second via 122 in the plane direction (plane distance) is more than the half of the width Φ of the first via 121 (Φ/2) (D>Φ/2). Preferably, the distance D between the first via 121 and the second via 122 in the plane direction (plane distance) is more than the width Φ of the first via 121 (D>Φ). The distance D may be equal to the width Φ. The distance L and/or the distance D may be less than a pitch or a center to center distance of adjacent bonded parts among a plurality of the bonded parts arrayed on the bonding faces. The distance L and/or the distance D may be less than an interval of adjacent bonded parts among a plurality of the bonded parts arrayed on the bonding faces. For example, if the bonded parts each having a width of 3 µm is arrayed at intervals of 3 µm, the pitch of the bonded parts is 6 µm. The distance L and/or the distance D is, for example, at least 100 nm; for example, at least 500 nm; for example, at least 1 µm; for example, not more than 100 µm, for example, not more than 10 µm; for example, not more than 5 µm; and for example, not more than 3 µm.

When the cross-sectional shape of the first via 121 is other than a circle, the width of the first via 121 is defined in each direction with respect to the central axis AXSA of the first via 121. That is, a width of the first via 121 in a certain direction is defined as a length of the first via 121 which includes the central axis AXSA thereof in this direction. A position at the range, distanced by the width of the first via 121, from the axis AXSA passing through the center of the first via 121 means a position at the range distanced, by the width of the first via 121 in each direction, from the central axis AXSA of the first via 121.

Figure 3B:
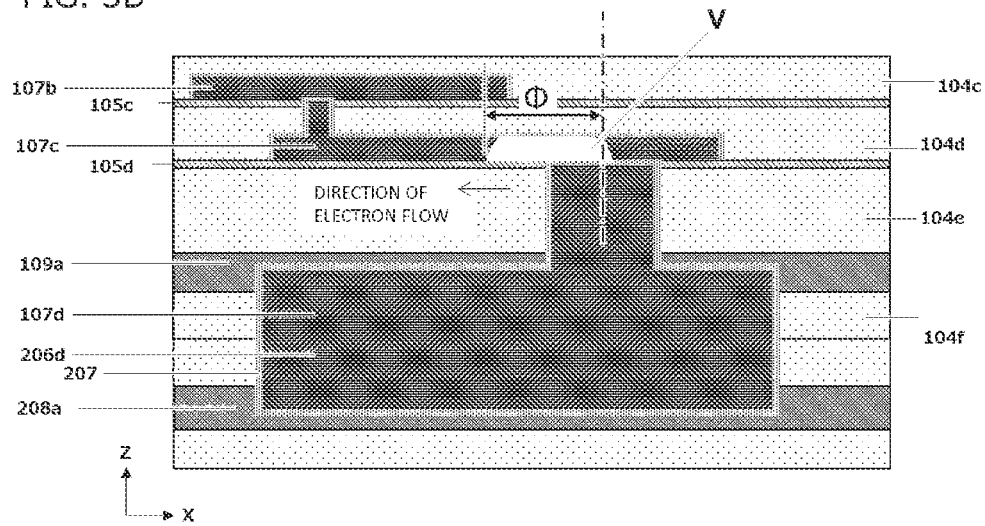

The effect of disposing the first via 121 and the second via 122 at a long plane distance from each other will be described with reference to FIG. 3B. When electrons flow from the first via 121 toward the second via 122, thermal and/or electrical stress may cause a void V in the wiring layer 107c. As one example, an electric field causes metal atoms that are a conductive material in the wiring layer 107c, such as copper, to move from the first via 121 toward the second via 122, which may result in formation of this void V. If some metal atoms move, metal atoms run short in a place where the metal atoms were originally present. Metal atoms are also present in the wiring layer 107d or the first via 121. However, replenishment of metal atoms from the wiring layer 107d to the wiring layer 107c is blocked because the barrier metal 108 exists between the metal atoms of the wiring layer 107d and the metal atoms of the wiring layer 107c. Therefore, a portion where metal atoms run short and are not replenished is generated, and this portion is thought to become the void V. Assuming that, as shown in FIG. 3B, the void V in the wiring layer 107c is grown from an end portion of the first via 121 by substantially the same amount as the diameter Φ of the first via. Inclusion of the entire of the second via 122 inside the distance L=Φ from the axis AXSA passing through the center of the first via 121 at that time leads to growing concern for breaking or the increase of the contact resistance between the first via 121 and the wiring layer 107*c*.

Especially, it is difficult to have the first via 121 of less processed dimensions as interconnect reliability is secured because the dielectric film 109*a*, which is arranged for preventing diffusion, is necessary to be a fine film having stronger stress than the dielectric film 104 on one hand, and is necessary to have a sufficient thickness on the other hand. For realizing this without an increase of the number of the wiring layers, the diameter Φ of the first via is more than twice as large as the diameter Φ' of the second via (Φ>Φ'×2), and in a more pronounced case, is more than three times as large as the diameter Φ'(Φ>Φ'×3). This leads to concern that the second via 122 or the wiring layer 107*c* is occupied by the void V before the first via 121 is occupied by the void V, to limit the interconnect lifetime. A case where a thickness H of the wiring layer 107*c* is less than the diameter Φ of the first via (H<Φ) also leads to concern that the wiring layer 107*c* is occupied by the void V priorly.

Disposing the second via 122 outside the range of the plane distance L=Φ from the axis AXSA passing through the center of the first via 121 where Φ is the diameter of the first via makes it possible to use the wiring layer 107*c* as a wiring routing layer as deterioration of the interconnect lifetime is suppressed, and to prevent the number of the wiring layers from increasing. More desirably, the second via 122 is located outside the range of the plane distance L=Φ×1.5 from the axis AXSA passing through the center of the first via 121. Satisfying this condition makes it possible to improve the reliability more certainly.

In this embodiment, the first via 121 and the second via 122 connected to the wiring layer 107*c* are arranged away from each other in the first wiring structure 150, as described above. In contrast, in the second wiring structure 250, a via connecting the wiring layer 206*d* or a fourth wiring layer and the wiring layer 206*c* or a fifth wiring layer, and a via connecting the wiring layer 206*c* and the wiring layer 206*b* are not necessarily arranged away from each other on the wiring layer 206*c*, and may be arranged at the same position in a plan view. This is because the wiring layer 206*c* is made from aluminum, so that a void is difficult to be generated at connection parts of the vias and the wiring layer 206*c*. The wiring layer 206*c* may be made from copper. In this case, the via connecting the wiring layer 206*d* and the wiring layer 206*c* is preferably arranged away from the via connecting the wiring layer 206*c* and the wiring layer 206*b* on the wiring layer 206*c*. When the wiring layer 107*c* in the first wiring structure 150 is made from aluminum, the first via 121 and the second via 122 are not necessarily arranged away from each other on the wiring layer 107*c*.

Figure 4:
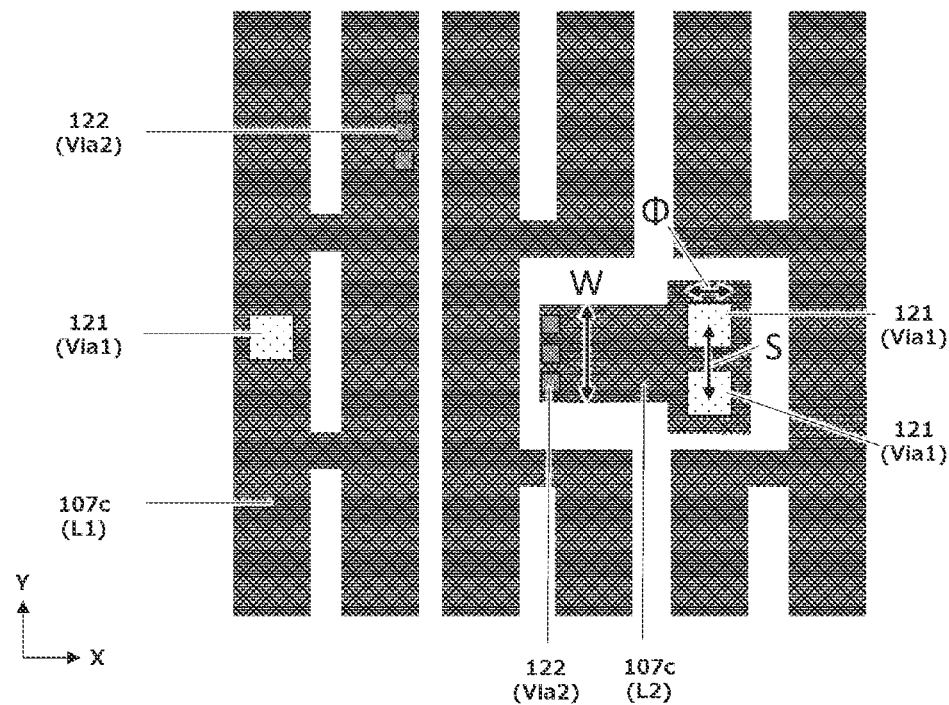
FIG. 4 is an explanatory schematic plan view of the semiconductor apparatus according to Embodiments.

The structure of the semiconductor apparatus APR will be described in more detail with reference to FIGS. 4 to 6. FIG. 4 shows the structure of the semiconductor apparatus APR on a XY plane, and only shows the wiring layer 107*c*, the first via 121 and the second via 122 in FIG. 2.

The wiring layer 107*c* has a plurality of lines. For example, a line L1 of the wiring layer 107*c* is connected to a power line or a grounding line (GND line), and there are a plurality of paths between the first via 121 and the second via 122 for reducing parasitic resistance. For example, a line L2 of the wiring layer 107*c* is connected to a pixel signal line, and there is a single path between the first via 121 and the second via 122.

Figure 5:
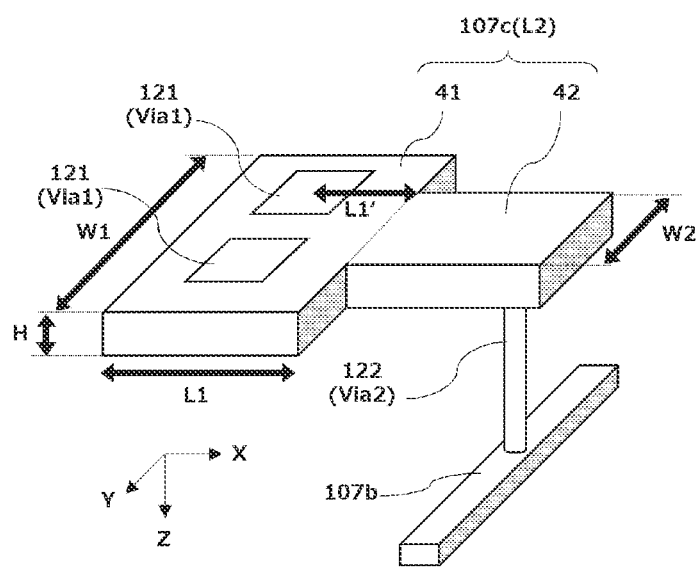
FIG. 5 is an explanatory perspective view of the semiconductor apparatus according to Embodiments.

FIG. 5 shows a perspective view of the line L2 of the wiring layer 107*c*, and the first via 121, the second via 122 and the wiring layer 107*b* connected to the wiring layer 107*c*. FIG. 6 is a plan view of a portion of the wiring layer 107*c* which is the line L2.

As shown, the line L2 of the wiring layer 107*c* has a first part 41 or a via connection pad to which the first via 121 is connected, and a second part 42 or a lead-out wire to which the second via 122 is connected. The first via 121 and the second via 122 align in the X direction. Thus, a direction where the first via 121 and the second via 122 are connected, or the X direction may be a typical direction of the electron flow. In this example, two first vias 121 are arranged in the first part 41 in parallel in a direction orthogonal to the direction of the electron flow or the X direction in the line L2, that is, in the Y direction. The number of the first vias 121 may be one, and may be at least three. The first vias 121 may be arranged in parallel to the direction of the electron flow or the X direction, and may be arranged in matrix.

Figure 6:
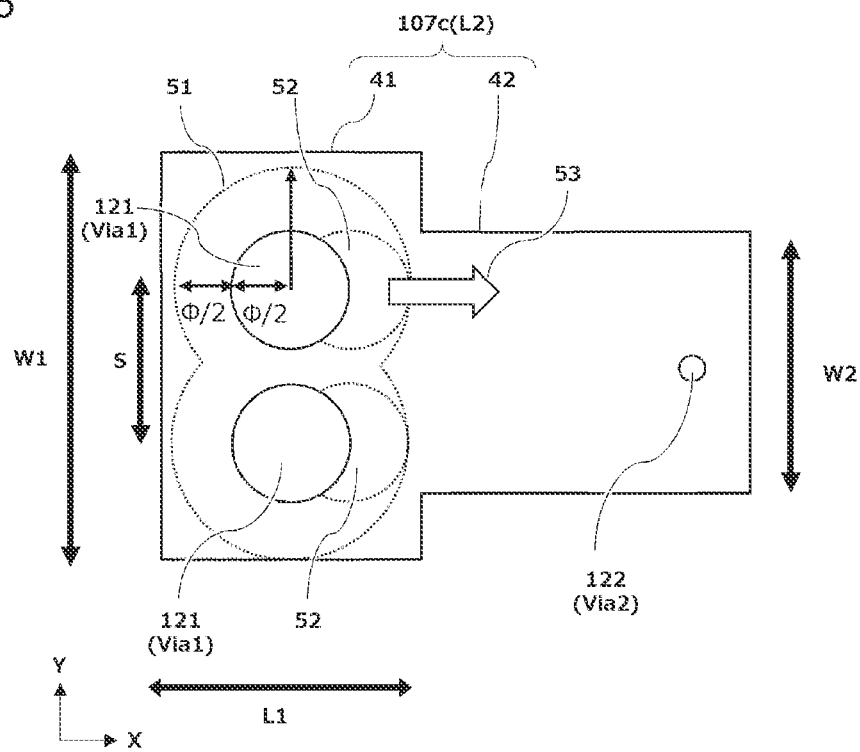
FIG. 6 is an explanatory enlarged schematic plan view of the semiconductor apparatus according to Embodiments.

In FIG. 6, a range 51 is a range of a plane distance within the diameter Φ of the first via with respect to the axis AXSA passing through the center of the first via 121. The second via 122 is located outside this range 51. As described above, breaking due to a void 52 can be prevented even if the void 52 is grown from the end portion of the first via 121 toward a downward direction of an electron flow 53 by substantially the same amount as the diameter 1 of the first via.

Desirably, predetermined conditions are also attached to the width of the line L2. Here, a width of a line means a length of the line in a direction orthogonal to the electron flow in the wire. First, a case where the number of the first via 121 connected to the line L2 is one is considered. If the size of the void 52 is grown by substantially the same amount of the diameter Φ of the first via 121, the line of a less width than the diameter Φ of the first via leads to breaking. Therefore, the width of the line L2 is desirably more than the diameter Φ of the first via. From the viewpoint that the void 52 is generated within the range 51 of the diameter Φ of the first via with respect to the axis AXSA passing through the center of the first via 121, the width of the line L2 is sufficient if being more than the diameter Φ of the first via in the range of the distance L=the diameter Φ of the first via, from the axis AXSA passing through the center of the first via 121. To improve reliability more, such a condition is desirably satisfied that the width of the line L2 is more than 1.5 times as much as the diameter Φ of the first via in the range of the distance L=the diameter Φ of the first via×1.5, from the axis AXSA passing through the center of the first via 121.

These conditions are satisfied as long as a length L1' between the border between the first part 41 and the second part 42, and the center of the first via in the direction of the electron flow or the X direction is L1'>Φ or L1'>1.5×Φ, and a width W1 of the first part 41 is W1>Φ or W1>1.5×Φ. Satisfying these conditions can result in a less possibility of breaking of the wiring layer 107*c* before the first via 121 is completely occupied by the void 52.

A width W2 of the second part 42 is not particularly limited. For example, the width W2 of the second part 42 may be more than the diameter Φ of the first via as well. That is, a width W (=W1 or W2) of the line L2 may be W=Φ in all the range of the first via 121 and the second via 122. Alternatively, the width W2 of the second part 42 may be less than the diameter Φ of the first via. For example, the width W2 may be less than ½ of the diameter of the first via.

Next, a case where two first vias 121 are connected to the line L2 of the wiring layer 107*c* in parallel in the direction orthogonal to the direction of the electron flow is considered. In this case, preferably, such a condition is further satisfied that the width of the line L2 is more than S where S is a distance between the most adjacent first vias 121, in the range of the distance L=the diameter Φ of the first vias, more preferably in the range of the distance L=the diameter Φ of the first vias×1.5, from the axis AXSA passing through the center of the first via 121. When at least two first vias 121 are connected in parallel, the width of the line is sufficient if being more than S as well where S is a distance between the most adjacent first vias 121. Applying these structures to any lines of higher current density, and a larger number of the first vias 121 can lead to a less probability of interconnect reliability failure.

To satisfy the above conditions, in this embodiment, the distance S between two first vias 121 is 0.57 µm. The width W1 of the first part 41 is 1.6 µm, and the length L1 thereof is 0.8 µm. The centers of the first vias 121 are located at the center of the first part 41 in the X direction, the length L1' between the centers of the first vias 121, and the border between the first part 41 and the second part 42, in the X direction is 0.4 µm (=L1/2), which is more than the diameter Φ of each of the first vias 121 (=0.38 µm). The width W2 of the second part 42 is 1.0 µm. The length of the second part 42 is not particularly limited, but desirably, the length between the axis AXSA passing through the center of the first via 121 and the axis AXSB passing through the center of the second via 122 is set to less than the pitch of the arrayed pixels PIX. The thickness H of the first part 41 and the second part 42 is 0.22 µm. Each of the sizes is not limited to a specific numeral value listed herein. For example, the width W1 of the first part 41 may be at least 0.8 µm and not more than 2.4 µm, and the length L1 may be at least 0.4 µm and not more than 1.2 µm. The width W2 of the second part 42 may be at least 0.5 µm and not more than 1.5 µm. The thickness H of the first part 41 and the second part 42 may be at least 0.11 µm and not more than 0.33 µm.

Figure 7:
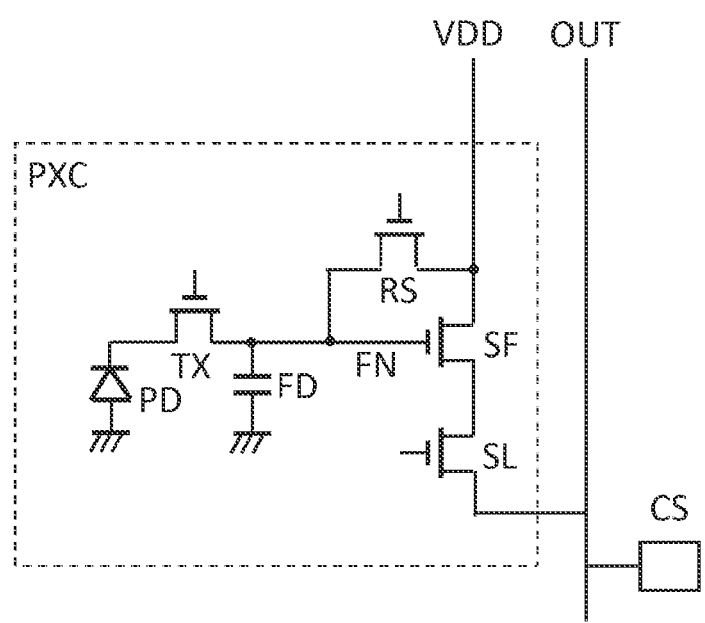
FIG. 7 is an explanatory circuit diagram of the semiconductor apparatus according to Embodiments.

FIG. 7 shows one example of the pixel circuits PXC. Each of the pixel circuits PXC includes a photoelectric conversion device PD, a transfer gate TX and a charge sensing capacitance FD. The pixel circuit PXC may include an amplifying transistor SF, a reset transistor RS and a select transistor SL. The charge sensing capacitance FD is configured by floating diffusion. The transfer gate TX, the amplifying transistor SF, the reset transistor RS and the select transistor SL are metal-insulator-semiconductor (MIS) transistors. The amplifying transistor SF may be a junction field effect transistor. A plurality of the photoelectric conversion devices PD may share one amplifying transistor SF.

Signal charge generated in the photoelectric conversion device PD is transferred to the charge sensing capacitance FD via the transfer gate TX. The charge sensing capacitance FD is connected to a floating node FN. A gate of the amplifying transistor SF, which forms a source follower circuit together with a current source CS, is connected to the floating node FN. In short, the gate of the amplifying transistor SF is connected to the charge sensing capacitance FD via the floating node FN. Pixel signals as voltage signals are outputted to a pixel signal line OUT. The reset transistor RS resets the charge and potential of the floating node FN, and the select transistor SL switches the connection of the amplifying transistor SF and the pixel signal line OUT. The reset transistor RS and the amplifying transistor SF are connected to a power feeder VDD. Each column of the pixel circuits PXC is provided with the pixel signal line OUT and the power feeder VDD. The pixel signal line OUT transfers pixel signals.

Here, for example, on the second part 42 of each of the wiring layers 107c (see FIGS. 4 to 6), the first via 121 is connected to the pixel signal line OUT, and the second via 122 is connected to the select transistor SL. The wiring layers 107d, that is, bonding members, are arranged at regular pitches for bonding the substrates, and the wiring layers 107b, that is, pixel signal lines, are arranged at pitches that are the same as the pixel circuits PXC. When both of the pitches are different, for example, the wiring layers 107c are connected as the lengths of the lines L2 thereof are adjusted, which can reduce the number of the wiring layers as much as possible. In contrast, in view of a void generated in the line L2 of each of the wiring layers 107c due to electromigration, the length of the line L2 is preferably short. This is because: microvoids are included in copper of part of the wiring layer 107c which is between the first via 121 and the second via 122a; more length of the line L2 of the wiring layer 107c leads to more microvoids in the line, and thus aggregation of the microvoids at a place where no copper atom is supplied in the vicinity of the barrier metal at the bottom of the first via 121 which is upstream the electron flow easily leads to a larger void. Therefore, the length of the wiring between the first via 121 and the second via 122 is preferably the same as or less than the pitch of the arrayed pixel circuits PXC. This makes it possible to lay the power lines or grounding lines to suppress parasitic resistance as further suppressing the growth of the void, and physically and electrically connect the bonded parts between the substrates, which are different in the pitches, and the vertical signal line.

Hereinafter the equipment EQP including the semiconductor apparatus APR and shown in FIG. 1 will be described in detail. As described above, the semiconductor apparatus APR may include the package PKG housing the semiconductor device IC in addition to the semiconductor device IC having the first substrate 100. The package PKG may include a base body to which the semiconductor device IC is fixed, a cover such as glass which faces the semiconductor device IC, and bonding members such as the bonding wires and bumps which connect terminals disposed on the base body and terminals disposed on the semiconductor device IC.

The equipment EQP may be provided with at least any of the optical system OPT, the controller CTRL, the processor PRCS, the display DSPL, the memory MMRY and the machinery MCHN. The optical system OPT is to form a light figure in the semiconductor apparatus APR. Examples of the optical system OPT include a lens, a shutter and a mirror. The controller CTRL controls the semiconductor apparatus APR. For example, the controller CTRL is configured by ASIC.

The processor PRCS processes signals outputted from the semiconductor apparatus APR. The processor PRCS is configured by CPU and ASIC that are for configuring an AFE or analog front-end, or a DFE or digital front-end. The display DSPL is an EL display or a liquid crystal display to display data or images obtained by the semiconductor apparatus APR. The memory MMRY is a magnetic device or a semiconductor device to store data or images obtained by the semiconductor apparatus APR. The memory MMRY is a volatile memory such as SRAM and DRAM, or a non-volatile memory such as a flash memory and a hard disk drive.

The machinery MCHN has a moving part or a driving part such as a motor and an engine. In the equipment EQP, signals outputted from the semiconductor apparatus APR are displayed on the display DSPL, and are also transmitted to the outside by a communication device included in the equipment EQP which is not shown. Therefore, preferably, the equipment EQP further includes the memory MMRY and the processor PRCS, separately from a storage circuit and an arithmetic circuit of the semiconductor apparatus APR. The machinery MCHN may be controlled based on signals outputted from the semiconductor apparatus APR.

The equipment EQP is suitable for electronic devices such as an information terminal having a photographing function, including a smartphone and a wearable terminal, and a camera including an interchangeable lens camera, a compact camera, a video camera and a security camera. The machinery MCHN in the camera can drive components of the optical system OPT for zooming, focusing and shutter operation.

The equipment EQP may be transport equipment such as a vehicle, a vessel and a flight vehicle. The machinery MCHN in the transport equipment may be used as a moving apparatus. The equipment EQP as transport equipment is suitable for equipment to transport the semiconductor apparatus APR, and equipment to assist and/or automate driving or operation by the photographing function. The processor PRCS for assisting and/or automating driving or operation can carry out processes for operating the machinery MCHN as a moving apparatus based on data obtained in the semiconductor apparatus APR. Alternatively, the equipment EQP may be medical equipment such as an endoscope, measurement equipment such as a ranging sensor, analytical equipment such as an electron microscope, and business equipment such as a copying machine. In the present embodiment, the example such that the semiconductor apparatus APR is a photoelectric convertor or a solid-state image pickup device has been described. The semiconductor apparatus APR, to Which the substrate to substrate wiring in the present embodiment is applicable, is not particularly limited as long as being a semiconductor apparatus using substrate to substrate wiring. For example, the semiconductor apparatus APR may be a display having a pixel region for display, an arithmetic apparatus such as CPU and GPU, a memory such as SRAM, DRAM and a non-volatile memory, and a controller such as ASIC.

The embodiments described above may be suitably changed as long as not deviating from the technical concept. The disclosure in the embodiments includes not only matters exhibited in the present description but also all the matters graspable from the present description and the drawings appended to this description.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-122012, filed on Jul. 16, 2020, which is hereby incorporated by reference herein in its entirety.

What is claimed is:

1. A semiconductor apparatus comprising:
a first substrate on which a semiconductor device is arranged;
a first wiring structure that is arranged on the first substrate;
a second substrate on which a semiconductor device is arranged; and
a second wiring structure that is arranged on the second substrate, wherein
the first wiring structure has a first wiring layer that is bonded to a fourth wiring layer of the second wiring structure, a second wiring layer that is connected to the first wiring layer by a first via, and a third wiring layer that is connected to the second wiring layer by a second via,
at least a part of the second via is located on a position at a range distanced, by at least a width of the first via, from an axis that passes through a center of the first via,
a thickness of the second wiring layer is less than the width of the first via,
a major constituent of the first wiring layer, the second wiring layer and the first via is copper, and
a layer that is made from a material different from copper is disposed between the first via and the second wiring layer.

2. The semiconductor apparatus according to claim 1, wherein the width of the first via is more than twice as large as a width of the second via.

3. The semiconductor apparatus according to claim 1, wherein the layer made from the material different from copper is a barrier metal layer.

4. The semiconductor apparatus according to claim 1, wherein the material different from copper is at least any of tantalum, tantalum nitride, titanium and titanium nitride.

5. The semiconductor apparatus according to claim 1, wherein a wiring width of the second wiring layer in a direction orthogonal to a direction where the first via and the second via are connected is more than the width of the first via at least in a range where a plane distance from the axis passing through the center of the first via is within the width of the first via.

6. The semiconductor apparatus according to claim 1,
wherein the second wiring structure has the fourth wiring layer that is bonded to the first wiring layer of the first wiring structure, and a fifth wiring layer that is connected to the fourth wiring layer by a via, and
wherein a major constituent of the fifth wiring layer is aluminum.

7. The semiconductor apparatus according to claim 1,
wherein at least a part of a pixel circuit is constituted of a portion of the first substrate and the first wiring structure,
wherein at least a part of a peripheral circuit is constituted of a portion of the second substrate and the second wiring structure, and
wherein the pixel circuit and the peripheral circuit are connected to each other via the fourth wiring layer.

8. The semiconductor apparatus according to claim 1,
wherein at least a part of a pixel circuit is constituted of a portion of the first substrate and the first wiring structure,
wherein at least a part of a peripheral circuit is constituted of a portion of the second substrate and the second wiring structure, and
wherein the pixel circuit and the peripheral circuit are connected to each other via the fourth wiring layer.

9. The semiconductor apparatus according to claim 5, wherein the first via and the second via are connected to a grounding wiring or a power wiring.

10. The semiconductor apparatus according to claim 5,
wherein a pixel circuit has a signal line that transfers a pixel signal outputted from the pixel circuit, and
wherein the first via and the second via are connected to the signal line.

11. The semiconductor apparatus according to claim 5, wherein in the second wiring layer, a length between the axis passing through the center of the first via and an axis that passes through a center of the second via is the same as or less than a pitch of pixel circuits that are arrayed.

12. The semiconductor apparatus according to claim 5, wherein pixel circuits have a matrix-arrayed pixel region, and a bonded part of the first wiring layer and the fourth wiring layer is superposed with the pixel region.

13. The semiconductor apparatus according to claim 1, wherein a distance between the axis passing through the center of the first via and the second via is more than the width of the first via.

14. The semiconductor apparatus according to claim 1, wherein a distance between the first via and the second via in a direction orthogonal to a direction where the first substrate and the second substrate are superposed is more than the width of the first via.

15. The semiconductor apparatus according to claim 1, wherein the first wiring layer has a damascene structure.

16. The semiconductor apparatus according to claim 1, wherein the second wiring layer has a dual damascene structure.

17. Equipment comprising:
the semiconductor apparatus according to claim 1; and
at least any of the following six:
an optical system forming an image on the semiconductor apparatus,
a controller controlling the semiconductor apparatus,
a processor processing a signal outputted from the semiconductor apparatus,
a display displaying information obtained by the semiconductor apparatus,
a memory storing the information obtained by the semiconductor apparatus, and
machinery having a moving part or a driving part.

18. A semiconductor apparatus comprising:
a first substrate on which a semiconductor device is arranged;
a first wiring structure arranged on the first substrate;
a second substrate on which a semiconductor device is arranged; and
a second wiring structure arranged on the second substrate, wherein
the first wiring structure has a first wiring layer that is bonded to a fourth wiring layer of the second wiring structure, a second wiring layer that is connected to the first wiring layer by a first via, and a third wiring layer that is connected to the second wiring layer by a second via,
at least a part of the second via is located at a range distanced, by at least a width of the first via, from an axis that passes through a center of the first via,
a thickness of the second wiring layer is less than the width of the first via, and
a wiring width of the second wiring layer in a direction orthogonal to a direction where the first via and the second via are connected is more than the width of the first via at least in a range where a plane distance from the axis passing through the center of the first via is within the width of the first via.

19. The semiconductor apparatus according to claim 18, wherein a width of a wiring of the second wiring layer between the first via and the second via is more than the width of the first via.

20. The semiconductor apparatus according to claim 18, wherein when at least two of the first vias are connected to the second wiring layer in parallel and assuming that a distance between most adjacent ones of the at least two of the first vias is S, the width of a wiring of the second wiring layer is more than S at least in a range where a plane distance from the axis passing through the center of the first via is within the width of the first via.

21. The semiconductor apparatus according to claim 18, wherein the width of the first via is more than twice as large as a width of the second via.

22. The semiconductor apparatus according to claim 18, wherein a distance between the axis passing through the center of the first via and the second via is more than the width of the first via.

23. The semiconductor apparatus according to claim 18, wherein a distance between the first via and the second via in a direction orthogonal to a direction where the first substrate and the second substrate are superposed is more than the width of the first via.

24. Equipment comprising:
the semiconductor apparatus according to claim 18; and
at least any of the following six:
an optical system forming an image on the semiconductor apparatus,
a controller controlling the semiconductor apparatus,
a processor processing a signal outputted from the semiconductor apparatus,
a display displaying information obtained by the semiconductor apparatus,
a memory storing the information obtained by the semiconductor apparatus, and machinery having a moving part or a driving part.

* * * * *